(12) United States Patent
Akaogi

(10) Patent No.: US 8,654,591 B2
(45) Date of Patent: Feb. 18, 2014

(54) LOCAL WORD LINE DRIVER AND FLASH MEMORY ARRAY DEVICE THEREOF

(75) Inventor: Takao Akaogi, Cupertino, CA (US)

(73) Assignee: Eon Silicon Solution Inc. (TW)

( * ) Notice: Subject to any disclaimer, the term of this patent is extended or adjusted under 35 U.S.C. 154(b) by 198 days.

(21) Appl. No.: 12/980,442

(22) Filed: Dec. 29, 2010

(65) Prior Publication Data
US 2012/0170377 A1   Jul. 5, 2012

(51) Int. Cl.
*G11C 16/06* (2006.01)
*G11C 16/08* (2006.01)

(52) U.S. Cl.
CPC ........................................ *G11C 16/08* (2013.01)
USPC ............ 365/185.23; 365/185.11; 365/185.33; 365/185.17; 365/230.03

(58) Field of Classification Search
CPC .... G11C 16/0475; G11C 16/08; G11C 16/16; G11C 16/0441; G11C 8/08
USPC ............ 365/185.11, 185.23, 185.13, 185.33, 365/185.12, 185.15, 230.03
See application file for complete search history.

(56) References Cited

U.S. PATENT DOCUMENTS

2011/0069558 A1 *   3/2011   Liao .......................... 365/185.23

* cited by examiner

*Primary Examiner* — Thong Q Le
(74) *Attorney, Agent, or Firm* — Schmeiser, Olsen & Watts, LLP

(57) ABSTRACT

In a local word line driver of an NOR flash memory and its flash memory array device, the local word line driver is provided for driving a local word line in a sector of a memory array, and the local word line driver has two transistors including a first transistor and a second transistors, and the first and second transistors are NMOS transistors, and thus achieving the effects of reducing the area occupied by circuits on the local word line driver and the die size, and saving the area for the use by memory units.

5 Claims, 4 Drawing Sheets

LOCAL WORD LINE DRIVER AND FLASH MEMORY ARRAY DEVICE THEREOF

FIELD OF THE TECHNOLOGY

The present invention relates to a design of semiconductor memory, in particular to a local word line driver of an NOR flash memory and its flash memory array device.

BACKGROUND

The core of semiconductor memory includes a memory array for storing information, and the memory array is composed of building blocks such as semiconductors, and magnetic or ferroelectric memory cells. In general, the aforementioned memory array is a two-dimensional array composed of many memory cells, and each memory unit can be addressed by a word line and a bit line which are perpendicular to one another. A conventional word line select column is provided for turning on a memory unit, and a bit line select column is used for accessing (reading or writing) a memory unit. If both word line and bit line are turned on, it means that a memory unit having with electrically connected word line and bit line is selected.

As the semiconductor manufacturing capacity enhances, the size of the memory unit becomes increasingly smaller, and the overall size of the memory array becomes increasingly smaller as well. However, if the area of the memory array is reduced, the percentage of an area used for controlling peripheral circuits to write or read data of the memory array with respect to the total area will be increased significantly. For example, a driving circuit is arranged at a peripheral area of the memory array for driving the word line, and the driving circuit is situated at a rear end of the word line for receiving voltage. Compared with the arrangement of memory arrays in a memory unit, the arrangement of transistors of a driving circuit is generally very loose. As the size of the memory array is reduced to a micro scale, the percentage of area occupied by the driving circuit with respect to the total area of the memory circuit in accordance to the prior art will be increased greatly.

With reference to FIG. 1 for a circuit block diagram of a local word line driver of a conventional NOR flash memory, each local word line driver 100 comprises a PMOS transistor QA, a first NMOS transistor QB and a second NMOS transistor QC, and the PMOS transistor QA is connected to the first NMOS transistor QB in series, and the second NMOS transistor QC is connected to the PMOS transistor QA in series. A gate of the PMOS transistor QA is coupled to a gate of the first NMOS transistor and coupled to a control terminal GN. A drain of the PMOS transistor QA is coupled to a drain control terminal D that applies a voltage, and a source of the PMOS transistor QA is coupled to a drain of the first NMOS transistor QB and a source of the second NMOS transistor QC, and coupled to a local word line WL of the memory array. A drain terminal of the first NMOS transistor QB is coupled to a source of the second NMOS transistor QC, and coupled to the local word line WL. A source of the first NMOS transistor QB is coupled to a source control terminal S. A gate of the second NMOS transistor QC is coupled to another control terminal GP. The aforementioned circuit is used for supplying read, program, erase biased voltage to a word line.

Therefore, three MOS transistors used for forming a local word line driver in accordance with the prior art occupy much area of the whole circuit. As the size of the memory cell arrays is reduced to the micro scale, it is unfavorable to have a word line driver occupying too much area.

SUMMARY

In view of the drawbacks of the prior art, it is a primary objective of the present invention to provide a local word line driver and its flash memory array device capable of reducing the area of the word line driver occupied in a circuit.

To achieve the foregoing and other objectives, the present invention discloses a local word line driver used for diving a local word line in a sector in a memory array of an NOR flash memory, and the local word line driver includes two transistors connected in series with each other, and the two transistors include a first transistor, which is an NMOS transistor having a gate terminal for receiving a first control signal of a global word line decoder, a drain terminal coupled to a drain control terminal for receiving a drain control signal, and a source terminal coupled to the local word line; and a second transistor, which is an NMOS transistor having a gate terminal for receiving a second control signal of the global word line decoder, a drain terminal coupled to a source terminal of the first transistor and coupled to the local word line, and a source terminal coupled to a source control terminal for receiving a source control signal. In the memory array of the NOR flash memory, each local word line driver on the same column shares the drain control terminal. In other words, the drain terminal of the first transistor of each local word line driver is coupled to the same drain control terminal.

In a preferred embodiment of the present invention, the source terminal of the second transistor shares the source control terminal with another word line driver in an adjacent sector.

In a preferred embodiment of the present invention, the global word line decoder has a first control terminal and a second control terminal coupled to the first transistor and the second transistor respectively.

To achieve the foregoing and other objectives, the present invention discloses a flash memory array device, comprising: a memory array, including a plurality of memory units divided into a plurality of blocks, and each block having a plurality of sectors, and each sector having a plurality of local word lines; a plurality of local word line drivers, each coupled to one of the corresponding local word lines, and each local word line driver having two transistors composed of a first transistor and a second transistors connected in series with each other, and the first and second transistors being NMOS transistors, and the drain terminal of the first transistor of each local word line being coupled to the same drain control terminal; and a plurality of global word line decoders, corresponding to the sectors and coupled to all local word line drivers in the corresponding sectors respectively.

In a preferred embodiment of the present invention, the sequence of arranging the first transistor and the second transistor in two adjacent local word line drivers of the same column and block is reverse.

Therefore, the present invention reduces the quantity of transistors used in the prior art down to two, and uses a special arrangement of the circuit to reduce the die size and save more area for the use of the memory units.

DETAILED DESCRIPTION

The objects, characteristics and effects of the present invention will become apparent with the detailed description of the preferred embodiments and the illustration of related drawings as follows.

Figure 1:
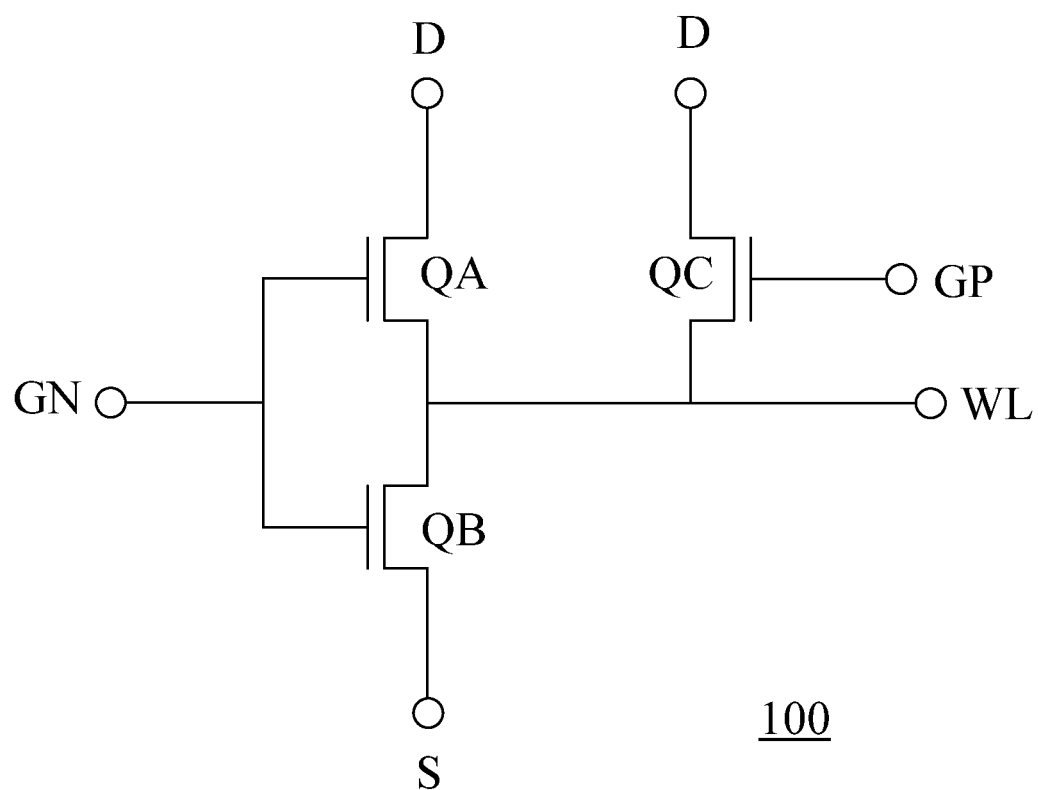
FIG. 1 is a circuit block diagram of a local word line driver of a conventional NOR flash memory.
Figure 2:
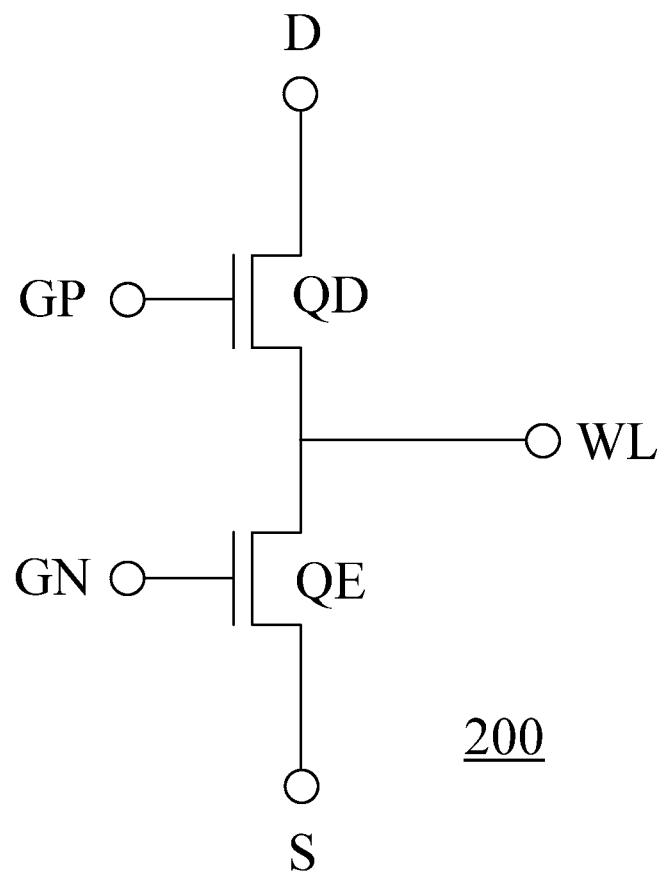
FIG. 2 is a circuit diagram of a local word line driver in accordance with a preferred embodiment of the present invention.

With reference to FIG. 2 for a circuit diagram of a local word line driver in accordance with a preferred embodiment of the present invention, the local word line driver 200 has two transistors including a first transistor QD and a second transistor QE, and the two transistors QD, QE are NMOS transistors connected in series with each other.

The first transistor QD has a gate terminal for receiving a first control signal transmitted from a control terminal GP of a global word line decoder (not shown in the figure), a drain terminal coupled to a drain control terminal D for receiving a drain control signal, and a source terminal coupled to a local word line WL for supplying a read, program or erase bias voltage to the local word line WL.

Figure 3A:
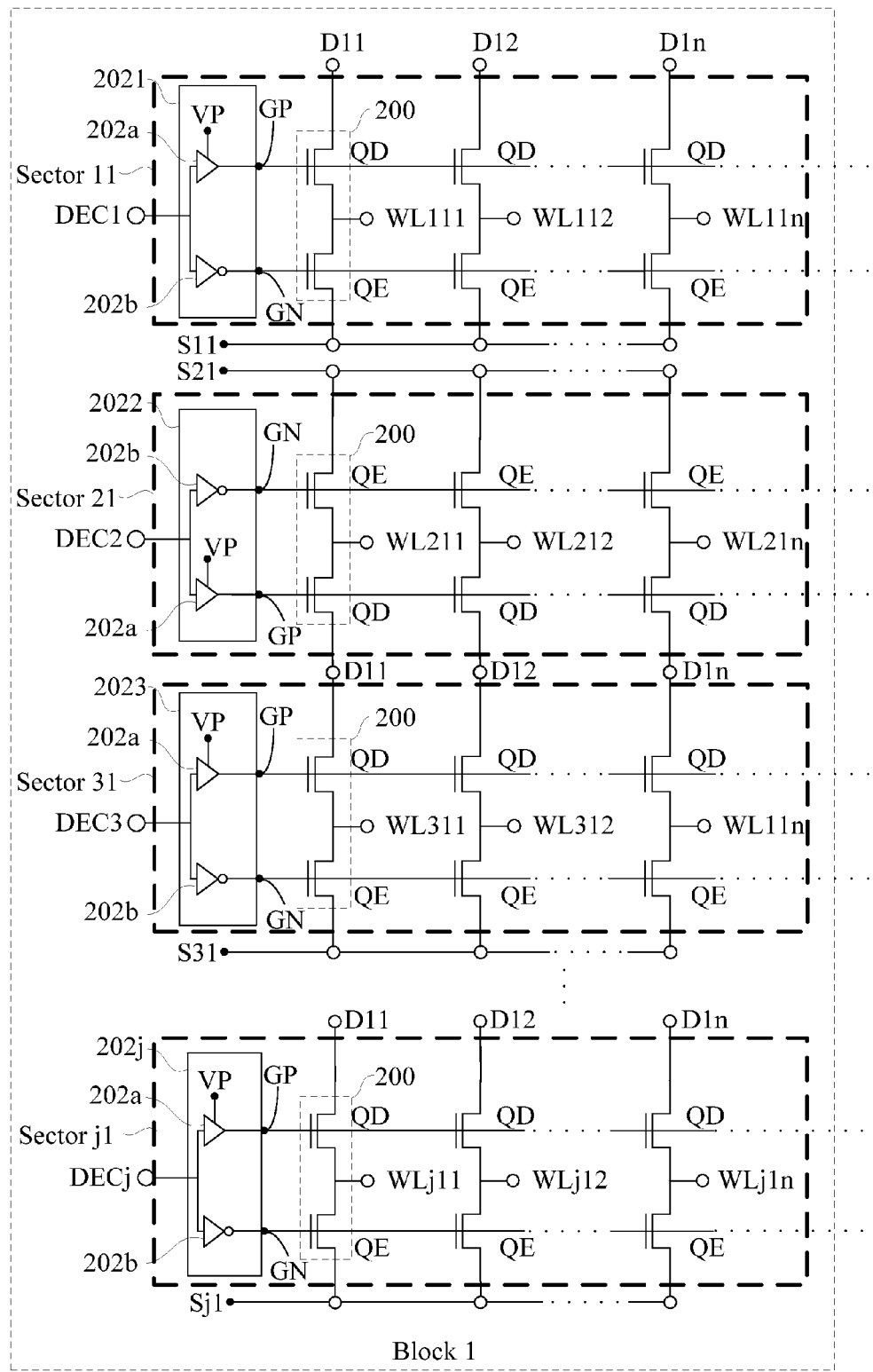
FIG. 3A is a planar view of a left portion of a local word line driver as depicted in FIG. 2 and applied to the overall word line driver.
Figure 3B:
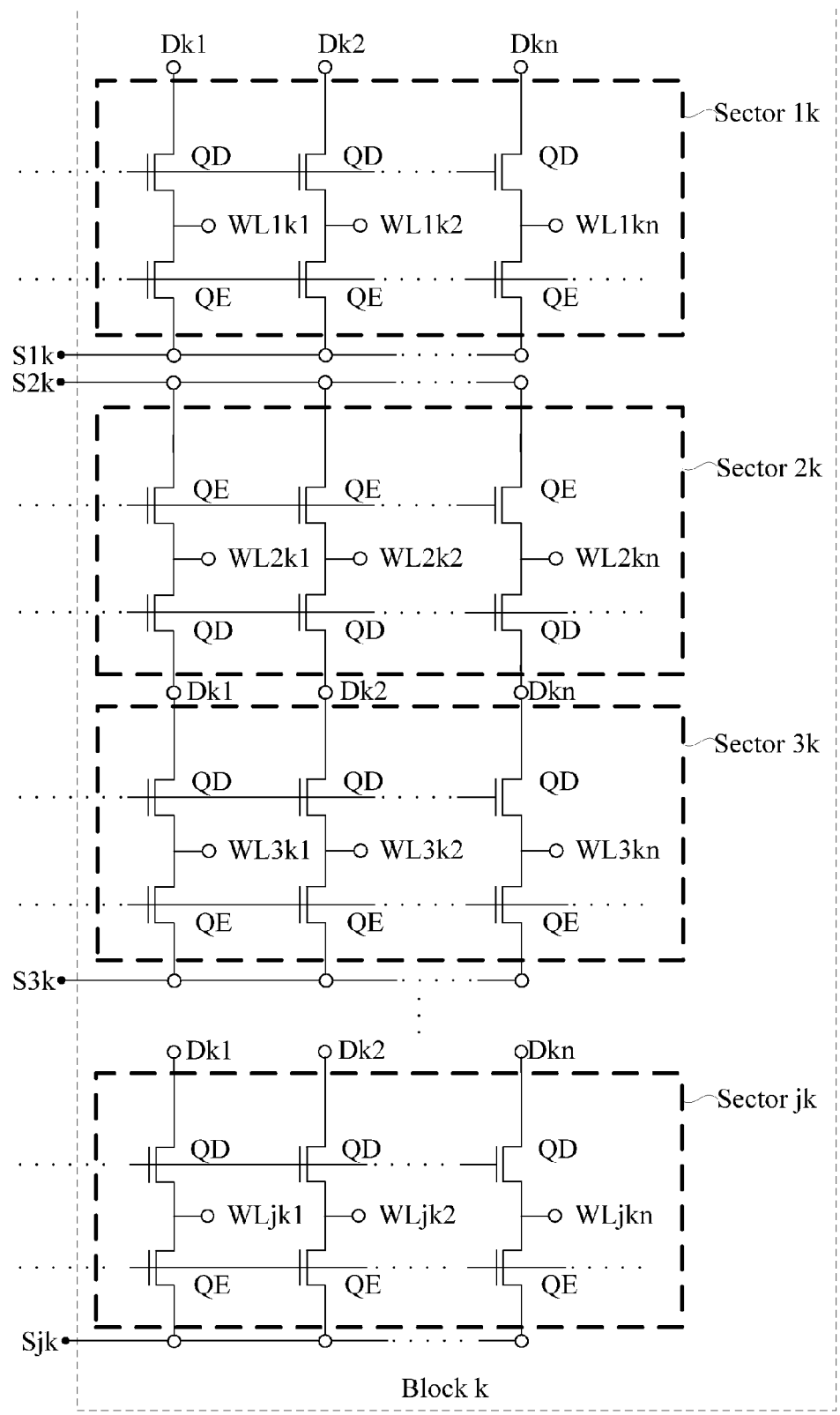
FIG. 3B is a planar view of a right portion of a local word line driver as depicted in FIG. 2 and applied to the overall word line driver.

In the memory array of the NOR flash memory in accordance with a preferred embodiment of the present invention, each local word line driver on the same column shares the drain control terminal D. The details are illustrated in FIGS. 3A and 3B as follows.

The operation conditions of a local word line driver of the present invention are listed in the following table:

TABLE 1

|    | Read(s) | Read(u) | Read(u) | PGM(s) | PGM(u) | PGM(u) | ER(s) | ER(u) |
|----|---------|---------|---------|--------|--------|--------|-------|-------|
| D  | Vread   | Vread   | Vss     | Vpp    | Vpp    | Vss    | Vss   | Vss   |
| S  | Vss     | Vss     | Vss     | Vss    | Vss    | Vss    | Vng   | Vss   |
| GP | VH      | Vss     | VH      | VHP    | Vss    | VHP    | Vng   | Vss   |
| GN | Vss     | Vcc     | Vss     | Vss    | Vcc    | Vss    | Vss   | Vss   |
| WL | Vread   | Vss     | Vss     | Vpp    | Vss    | Vss    | Vng   | Float |

If a local word line driver is selected, which refers to a state (s), the control terminal GP will transmit a first control signal (VH) with a high voltage level to a gate terminal of the first transistor QD to turn on the first transistor QD in the condition that the Read (s) is in a read mode, such that the drain control signal (which is Vread now) transmitted from the drain control terminal D can be transmitted to the local word line WL to drive the corresponding memory unit to proceed with a reading procedure. In the read mode, the second control signal transmitted from the control terminal GN to the second transistors QE has a low voltage level Vss, and the second transistors QE will not be turned on under the serial connection, so that the low voltage level Vss of the source terminal applied to the second transistor QE through the source control terminal S will not be transmitted to the local word line WL.

Similarly, if the local word line driver is selected, the control terminal GP transmitting a first control signal (VHP) with a high voltage level will turn on the first transistor QD in a program mode PGM(s), such that the drain control signal (which is Vpp now) can be transmitted from the drain control terminal D to the local word line WL to drive the corresponding memory unit to perform a programming process. In an erase mode ER(s), the control terminal GP transmits a first control signal (Vng) with a negative voltage level to a gate terminal of the first transistor QD, and the control terminal GN transmits a second control signal (Vss) with a low voltage level to a gate terminal of the second transistor QE, and the two transistors connected in series can turn on the second transistor QE, such that the source control signal (which is Vng now) transmitted from the source control terminal S can be transmitted to the local word line WL to perform an erase process for the corresponding memory unit.

If the local word line driver has not been selected, which refers to a state (u), and a read mode Read (u) and a program mode PGM(u) as shown in the table will apply a voltage with a different level opposite to the selected mode to the first transistor QD and second transistors QE to control the voltage signal that is applied to the local word line WL by the local word line driver 200. When the local word line driver is not selected, the second read mode Read(u) as shown in the table will control the output of the local word line driver 200 through the voltage signal transmitted from the drain control terminal D.

If the local word line driver has not been selected, and it is situated at the erase mode ER(u), the first and second transistors QD, QE will receive a voltage signal Vss with the same low voltage level, such that the output from the local word line driver 200 will be floating.

The operation modes shown in Table 1 are provided for the illustration purpose only, but other operation modes can be applied to the local word line driver of the present invention to achieve the same effect. For example, if the local word line driver has not been selected and it is situated at the erase mode, the source control signal transmitted from the source control terminal S will be floating.

With reference to FIGS. 3A and 3B for partial planar views of left and right portions of a local word line driver as depicted in FIG. 2 and applied to an overall word line driver, the local word line driver shown in the figures is divided into a left portion and a right portion, and the left and right portions can be combined to obtain a planar view of the whole circuit, and the overall structure of the word line driver comprises a plurality of blocks Block 1~k corresponding to memory units in a memory array, and each block has a plurality of sectors Sector 11~jk, and each sector has a plurality of word lines and a plurality of local word line drivers 200 for driving the word lines. All sectors in the same column have corresponding global word line decoders 202j (j∈N), and the global word line decoder 202j has a first control terminal GP and a second control terminal GN for transmitting a first control signal and a second control signal to the connected first transistor QD and second transistors QE respectively (refer to FIG. 2).

In the figure, the drain terminal of the first transistor QD of each local word line driver 200 on the same column (such as Column 11) is coupled to the same drain control terminal D (such as D11). In other words, a control line of the drain control terminal D is installed across the memory array to drive the local word line drivers 200 situated on the same column.

In a preferred embodiment, the global word line decoder 202j comprises a first driver 202a and a second driver 202b corresponding to the first control terminal GP and the second control terminal GN respectively. The first driver 202a is controlled by an external signal VP, and the second driver 202b is an inverter (inverter). Each global word line decoder 202j is controlled by a corresponding decode signal DECj (j∈N), and the predetermined voltage is outputted from the first driver 202a and the second driver 202b (as shown in Table 1) to the first transistor QD and the second transistors QE respectively.

In a preferred embodiment as shown in FIGS. 3A and 3B, a drain terminal of the first transistor QD of the local word line driver 200 on the same column (such as column 11) is coupled to the same drain control terminal D (such as D11). Therefore, the arrangement sequence of the first transistor QD and second transistors QE in the adjacent local word line drivers of the same column and block are exactly reverse (refer to FIGS. 3A and 3B). Similarly, the same applies to the corresponding first driver 202a and second driver 202b, such that the circuit area can be reduced. In FIGS. 3A and 3B, two adjacent sectors (such as sector 21 and sector 31) and another adjacent sector (such as sector j) share the same drain control terminal D11, D12, D1n, Dk1, Dk2, Dkn.

In addition, the required voltage of the local word lines under the programming mode is approximately equal to 10 volts, and the voltage received by the gate terminal (wherein the voltage comes from an external signal VP) for conducting the first transistor QD (wherein the voltage of the drain control terminal subtracts the critical voltage Vth of the transistor, and the resulted voltage is transmitted to the word line) is greater than the voltage of the drain control terminal. To minimize the voltage of the external signal VP, the first transistor of each local word source line driver is a transistor with the lowest critical voltage.

In summation of the description above, the present invention adopts two NMOS transistors in the local word line driver, and thus achieving the effects of reducing the die size and saving more space for the use by memory units.

While the invention has been described by means of specific embodiments, numerous modifications and variations could be made thereto by those skilled in the art without departing from the scope and spirit of the invention set forth in the claims.

What is claimed is:

1. A local word line driver for driving a local word line in a sector of a memory array of an NOR flash memory, the local word line driver having two transistors, comprising only a first transistor and a second transistor connected in series with each other, wherein:
   the first transistor is an NMOS transistor having a gate terminal for receiving a first control signal of a global word line decoder, a drain terminal coupled to a drain control terminal for receiving a drain control signal, and a source terminal coupled to the local word line; and
   the second transistor is an NMOS transistor having a gate for receiving a second control signal of a global word line decoder, a drain terminal coupled to a source terminal of the first transistor and coupled to the local word line, and a source terminal coupled to a source control terminal for receiving a source control signal;
   further wherein in the memory array of the NOR flash memory, each local word line driver is on the same column shares the drain control terminal.

2. The local word line driver of claim 1, wherein the global word line decoder includes a first control terminal and a second control terminal coupled to the first transistor and the second transistor respectively.

3. A flash memory array device, comprising:
   a memory array, having a plurality of memory units divided into a plurality of blocks, and each block having a plurality of sectors, and each sector having a plurality of local word lines;
   a plurality of local word line drivers, each coupled to one of the corresponding local word lines, and each local word line driver having two transistors comprising only a first transistor and a second transistor connected in series with each other, and the first and second transistors being NMOS transistors, and the drain terminal of the first transistor of each local word line on the same column being coupled to the same drain control terminal; and
   a plurality of global word line decoders, corresponding to the sectors and coupled to all local word line drivers in the corresponding sectors respectively.

4. The flash memory array device of claim 3, wherein in each local word line driver, the first transistor includes the gate terminal for receiving a first control signal of the corresponding global word line decoder, the drain terminal coupled to the drain control terminal, and a source terminal coupled to the corresponding local word line; and the second transistor includes the gate terminal for receiving a second control signal of the corresponding global word line decoder, the drain terminal coupled to a source terminal of the first transistor and coupled to the corresponding local word line, and a source terminal coupled to the source control terminal.

5. The flash memory array device of claim 4, wherein a sequence of arranging the first transistor and the second transistor in two adjacent local word line drivers of the same column and block is reverse.

* * * * *